(12) United States Patent
Barnard (10) Patent No.: US 7,714,285 B2
(45) Date of Patent: May 11, 2010

(54) SPECTROMETER FOR SURFACE ANALYSIS AND METHOD THEREFOR

(75) Inventor: Bryan Robert Barnard, Nutley (GB)

(73) Assignee: Thermo Fisher Scientific Inc., Waltham, MA (US)

( * ) Notice: Subject to any disclaimer, the term of this patent is extended or adjusted under 35 U.S.C. 154(b) by 810 days.

(21) Appl. No.: 11/588,689

(22) Filed: Oct. 27, 2006

(65) Prior Publication Data
US 2007/0115468 A1    May 24, 2007

(30) Foreign Application Priority Data
Oct. 28, 2005    (GB) ................... 0522060.3

(51) Int. Cl.
*G01N 23/00* (2006.01)
(52) U.S. Cl. .............. 250/306; 205/307; 205/310; 205/311; 205/305; 205/396 R
(58) Field of Classification Search ......... 250/305, 250/396 R
See application file for complete search history.

(56) References Cited

U.S. PATENT DOCUMENTS

| | | | |
|---|---|---|---|
| 3,617,739 A | | 11/1971 | Liebl |
| 3,845,305 A | | 10/1974 | Liebl |
| 3,917,402 A | * | 11/1975 | Ohta ..................... 356/71 |
| 4,255,661 A | | 3/1981 | Liebl |
| 4,810,879 A | * | 3/1989 | Walker ................. 250/305 |
| 4,990,776 A | * | 2/1991 | Fushimi et al. ......... 250/310 |
| 5,003,172 A | * | 3/1991 | Kruit et al. ............ 250/305 |
| 5,168,166 A | * | 12/1992 | Hayakawa et al. ...... 250/492.2 |
| 5,198,675 A | * | 3/1993 | Hikita et al. ........... 250/397 |
| 5,683,547 A | * | 11/1997 | Azuma et al. .......... 438/695 |
| 6,201,241 B1 | * | 3/2001 | Koike ................. 250/310 |
| 6,373,070 B1 | * | 4/2002 | Rasmussen .......... 250/492.21 |

(Continued)

FOREIGN PATENT DOCUMENTS

EP    0284683 A2    10/1988

(Continued)

OTHER PUBLICATIONS

Liebl, et al., "Low-Energy Electron Microscope of Novel Design," Ultramicroscopy, Elsevier Science Publishers B.V. (North Holland), p. 91-98, (1991).

*Primary Examiner*—David A Vanore
*Assistant Examiner*—Andrew Smyth
(74) *Attorney, Agent, or Firm*—Charles B. Katz (57) ABSTRACT

A spectrometer (10) for sample surface analysis by irradiation of the surface by primary particles and a corresponding method of surface analysis spectroscopy. The spectrometer (10) provides sample viewing and secondary charged particle collection substantially normal to the sample surface. A collection chamber (22) comprises a secondary charged particle lens arrangement (20) to focus the emitted particles in a downstream direction along a first normal axis (24) and thereby to define a charged particle optical crossover location (25); and a light-reflecting optical element (50) downstream of the lens arrangement and arranged to receive image light (41) and reflect it away from a second normal axis (42) for providing a viewable image of the surface. The optical element (50) is positioned at, or near to, the crossover location (25) and comprises an opening (52) therethrough, such that the focused particles pass through the opening for downstream spectroscopic analysis substantially without obstruction by the optical element.

18 Claims, 8 Drawing Sheets

U.S. PATENT DOCUMENTS

| | | | |
|---|---|---|---|
| 6,667,477 B2 * | 12/2003 | Grzelakowski | 850/9 |
| 6,765,609 B1 * | 7/2004 | Kinoshita | 348/222.1 |
| 7,045,791 B2 * | 5/2006 | Benas-Sayag et al. | 250/396 R |
| 7,141,804 B1 * | 11/2006 | Akselrod et al. | 250/483.1 |
| 7,205,542 B1 * | 4/2007 | Mankos et al. | 250/310 |
| 7,292,320 B2 * | 11/2007 | Takami | 356/30 |
| 7,297,948 B2 * | 11/2007 | Benas-Sayag et al. | 250/306 |
| 7,470,901 B2 * | 12/2008 | Page et al. | 250/305 |
| 7,573,050 B2 * | 8/2009 | Benas-Sayag et al. | 250/492.2 |

FOREIGN PATENT DOCUMENTS

| | | | |
|---|---|---|---|
| GB | 1426359 | | 2/1976 |
| GB | 2138626 A | | 10/1984 |
| GB | 2149569 A | | 6/1985 |
| JP | 6124683 | | 5/1994 |
| JP | 10223168 | | 8/1998 |
| JP | 10223168 A | * | 8/1998 |
| WO | WO 2004/079771 A2 | | 9/2004 |

* cited by examiner

SPECTROMETER FOR SURFACE ANALYSIS AND METHOD THEREFOR

CROSS REFERENCE TO RELATED APPLICATION

This application claims priority to United Kingdom Patent Application No. GB0522060.3 filed 28 Oct. 2005, entitled "Spectrometer for Surface Analysis and Method Therefor", which application is incorporated herein by reference in its entirety.

BACKGROUND OF THE INVENTION

1. Field of the Invention

The invention relates to a spectrometer for surface analysis of a sample, the spectrometer having optical sample viewing capability, and to a corresponding method for surface analysis spectroscopy. The invention relates particularly, but not exclusively, to sample analysis by means of secondary electron energy spectroscopy, such as X-ray photoelectron spectroscopy or Auger electron spectroscopy.

2. Description of the Related Art

Chemical and physical analysis of the surface of a sample generally requires the excitation of that surface with a primary beam of "particles", such as ions, electrons, photons or atoms, and the detection of secondary particles which are emitted from the surface and whose characteristic energy or mass is measured. The energy or mass spectrum obtained is used to provide information about the chemical or elemental composition of the sample. There are many known techniques employing this form of analysis, including for example Auger electron spectroscopy (AES), X-ray photoelectron spectroscopy (XPS), ultraviolet photoelectron spectroscopy (UPS), and secondary ion mass spectrometry (SIMS).

The majority of these techniques use a vacuum system in which the analysis is performed. A primary particle beam generator is employed to provide a beam of irradiation which is directed towards an analysis area of the spectrometer, at which location is placed a sample, held in a vacuum analysis chamber. The secondary charged particles emitted from the surface of the sample are then collected by a charged particle collection lens arrangement from where they pass into a spectroscopic analyser in which their energies or masses are determined.

In addition to making spectral observations of the secondary particles from the sample, it is generally desirable also to be able to view the surface of the sample visually, using an optical microscope. Such a microscope may be arranged so that the surface can be visually observed while secondary particles are collected from the surface. Alternatively, or additionally, the microscope may be used to identify and define an area of analysis, especially where analysis is to be made of a small area of the sample surface. The ability to perform simultaneous visual and spectral observations is particularly desirable during system set-up.

For more than 20 years, surface analysis systems have been manufactured with the charged particle collection lens arrangement being mounted at, or close to, the normal to the surface of a sample. Such systems include the Thermo VG ESCALAB systems, manufactured by Thermo Electron Corporation of Delaware, USA, and KRATOS ULTRA XPS systems, manufactured by KRATOS Analytical (a subsidiary of SHIMADZU Corporation), of Manchester, United Kingdom, among others. Where a system includes an optical microscope, this is mounted at an angle to the normal to the sample surface, typically 45°. A separate light source providing illumination to the area under investigation on the sample surface is then similarly mounted, at any angle to the axis of the optical microscope.

However, the quality of the viewed image from this sample viewing geometry is generally poor, with the sample image only being truly in focus at the centre of the field of view and out of focus towards the edges, because of the angle from which the sample is viewed. In addition, when the sample surface is illuminated by the light source, shadows formed as a result of the sample's surface topography can degrade the image quality, for the same reason. Furthermore, when the sample height is changed, the analysis position on the sample, as viewed by the optical microscope, also appears to move. This sample viewing geometry is therefore not desirable for identifying the analysis position.

An arrangement which provides optical viewing normal to the sample is the electron probe micro-analyser (EPMA) manufactured by Cameca of Courbevoie Cedex, France. However, the EPMA is a wavelength-dispersive X-ray microanalysis (WDX) system, in which the secondary particles are not charged particles, but X-ray photons. The optical axis leaving the sample for the microscope is mounted normal to the sample surface, along with the primary electron beam generator. The primary beam's probe-forming optics produce a very narrow beam, which is arranged to pass through a small hole in the centre of a conventional microscope Schwarzschild reflective objective disposed just above the sample. The secondary particles, which are X-ray photons, are collected for measurement at approximately 45° to the normal.

For the Cameca EPMA, the use of off-axis X-ray collection leads to a reduced sensitivity, particularly for soft X-ray emission. Moreover, this system cannot be used for secondary charged particle analysis.

Secondary charged particle systems having the optical microscope mounted normal to the sample surface are also known; for example, the SSI X and S probe systems, manufactured by Surface Science Instruments of California, USA, and the Thermo Thetaprobe, manufactured by Thermo Electron Corporation. In these systems, the charged particle collection lens arrangement is mounted at an angle of typically 55° to the normal.

While visual observations with such sample viewing geometries may be of better quality, this is at the expense of potentially significant degradation in the analysis sensitivity of the instrument for the SSI X and S probe and Thermo Thetaprobe systems, due to the off-axis collection of the secondary charged particles.

Generally, in order to save space in the laboratory, several different surface analysis instruments are provided together, in a multitechnique system. Such a system may then be operated in any particular surface analysis mode, or sequence of modes on the same sample, as required by the application.

Each different analysis mode may require its own primary column and secondary column. Including access for an optical camera, a sample illumination source, a vacuum pump, sample entry and the like, the analysis chamber for such a multitechnique system must therefore be provided with a large number of chamber ports. Furthermore, all of the ports which are relevant for the collection of surface analysis data must be directed at the sample analysis area.

The actual location and configuration of each chamber port is accordingly a matter of balancing the competing desires of accommodating the hardware for each instrument without overcrowding the chamber; favourably positioning the primary beam column for each instrument; favourably positioning the secondary beam column for each instrument; and favourably positioning the ports used in common by all of the analysis instruments.

Figure 8:
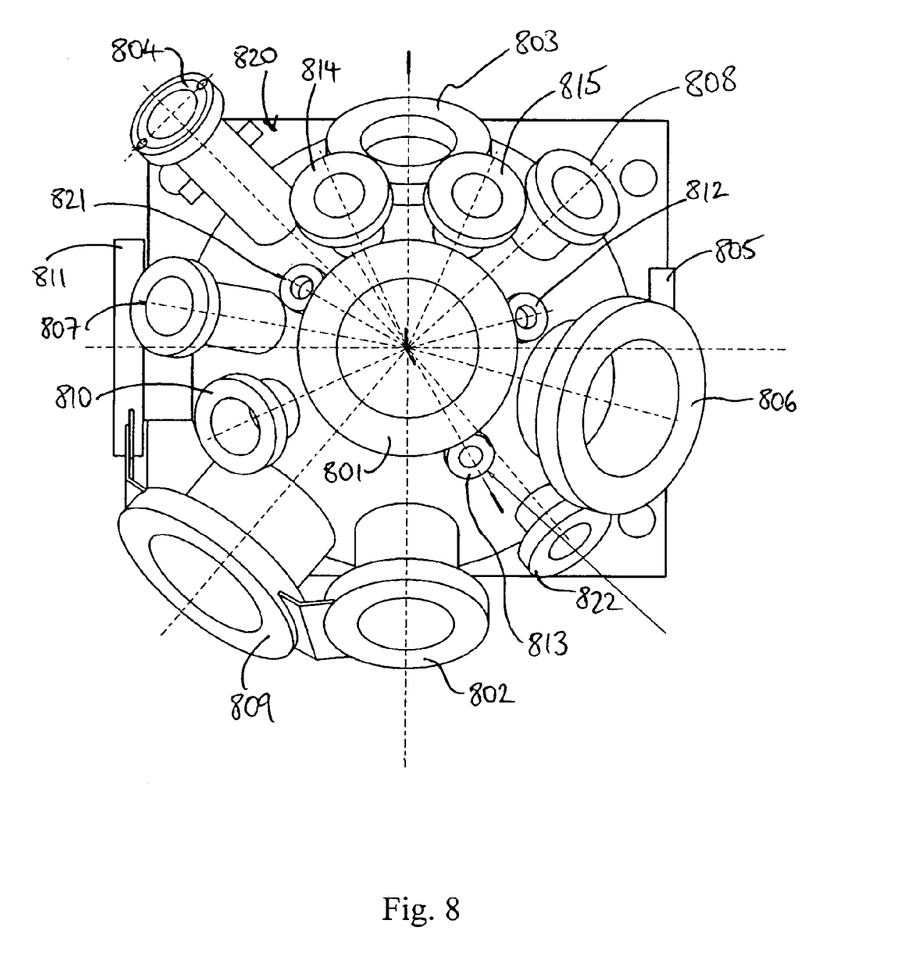
FIG. 8 shows a plan view of a multitechnique analysis chamber according to the prior art.

The ESCALAB system is one example of a mutitechnique system, a typical chamber arrangement for which is illustrated in FIG. 8. Table 1 below lists the port assignments for the arrangement.

TABLE 1

| Port | Port assignment | Assignment description |
|---|---|---|
| 801 | Lens assembly | Collection lens for charged secondary particles. |
| 802 | Electron gun | Source of primary electron beam for AUGER experiments |
| 803 | X-ray monochromator | Primary X-ray source using a quartz crystal X-ray monochromator |
| 804 | X-ray source | Primary un-monochromated X-ray source |
| 805 | Entry chamber | Sample pump-down chamber or sample preparation chamber |
| 806 | Quad SIMS | Quadrupole detector for SIMS experiments |
| 807 | Scintillator | Low energy electron detector for scanning electron microscope (SEM) imaging |
| 808 | Ion gun | Ion beam source for depth profiling/sample cleaning ion scattering spectroscopy (ISS) or SIMS |
| 809 | View port | Large glass window to view sample by eye |
| 810 | CCD camera | Glass window through which CCD microscope sample viewing occurs |
| 811 | Stage port | Mounting for stage to move sample around inside vacuum |
| 812 | Light | Glass window for sample illumination |
| 813 | Iris control | Mounting for collection lens F/number aperture mechanism |
| 814 | Spare | Often used for residual gas analysis (RGA) or an additional light source |
| 815 | Flood gun | Low energy electron gun for charge neutralisation of sample |
| not shown | Pumping port | Port through which chamber may be evacuated to ultra high vacuum |
| not shown | Beam port | Port for connecting system to beam line primary X-ray sources |
| 820 | Magnetic lens | Mounting for magnetic collection lens (fitted below sample) |
| 821 | Gas dosing | Port for admission of gas for surface reaction experiments |
| 822 | U.V. source | Source of ultraviolet primary radiation for UPS analysis |

In view of the formidable problem of optimising the configuration of the instrument ports in an analysis chamber, a number of alternative approaches have been proposed.

One approach, employed in the NanoSIMS system, also manufactured by Cameca, involves performing the spectral observation and visual observation of the sample at different locations. In the NanoSIMS system, the sample is translated between an analysis position for spectral observation and a remote position for optical viewing.

Another approach, used in the Quantum and Quantera systems, manufactured by Ulvac-PHI of Kanagawa, Japan, the analysis chamber is entirely separate from the optical microscope, and CCD images are recorded on the microscope workbench before the sample is introduced into the analysis chamber.

While both visual and spectral observations may be made with the optical microscope axis and the collection lens arrangement axis respectively being normal to the sample surface, this approach has a significant disadvantage in that the sample cannot be optically viewed during spectral analysis. In addition, the co-ordinate system for mounting and moving the sample must be very accurate.

It would be desirable, therefore, to provide a charged particle spectrometer capable of making spectral observations of secondary charged particles with high sensitivity and of producing optical images of the sample with high quality. The invention aims to address the foregoing desires by providing an improved charged particle spectrometer.

SUMMARY

According to a first aspect of the present invention, there is provided a spectrometer for surface analysis of a sample by irradiation of the sample surface by primary particles, the spectrometer comprising: a collection chamber for receiving secondary charged particles and image light from the sample surface, the collection chamber having a first axis in use substantially normal to the sample surface, the collection chamber comprising: a secondary charged particle lens arrangement arranged to focus at least a proportion of the emitted secondary charged particles in a downstream direction along the first axis and thereby to define a charged particle optical crossover location; and a light-reflecting optical element positioned downstream of the secondary charged particle lens arrangement and having a second axis in use substantially normal to the sample surface, the optical element being arranged to receive image light from the sample surface and to reflect that light away from the second axis for providing a viewable image of the sample surface, wherein the optical element is positioned at, or near to, the charged particle optical crossover location and the optical element comprises an opening therethrough, such that at least a proportion of the focused secondary charged particles may pass through the opening for undergoing spectroscopic analysis downstream thereof substantially without obstruction by the optical element.

The opening, or aperture or hole, is a vacant or unobstructed space within the collection chamber which serves as a passageway for the secondary charged particles travelling through the collection chamber and on to a spectroscopic analyser, for example. As such, the secondary charged particles may be collected substantially normally—i.e. disposed and then focused about the first axis substantially normal to the sample surface in use at the analysis area of the spectrometer—from the sample surface, without impairing the collection efficiency of the instrument, while also permitting normal sample viewing to take place—i.e. receipt of image light at the optical element disposed about the second axis for providing a viewable image.

When considering the secondary charged particles, the first axis is referred to as the collection axis; when considering the image light, the second axis is referred to as the objective optical axis.

Preferably, the first and second axes are coincident (coaxial), although it will be understood that the advantages of the invention are still provided if there is a small angle between them, preferably with the axes intersecting at the sample. Alternatively still, the axes may be parallel to each other, but have a relatively small lateral separation providing that what is viewed optically from a sample is substantially the same area as that emitting secondary charged particles for spectroscopic analysis. Typically, the separation should be no more than about 200 microns.

The arrangement of the objective optical axis, that is the axis about which an optical element is disposed to receive image light directly emanating from an object at the analysis area, normal to the sample surface in use at the analysis area offers the capability of providing the best possible image quality. In addition, providing the spectrometer with a means of collecting the secondary particles in a direction which is normal to the sample surface in use at the analysis area results in the best count rate and allows the highest possible sensitivity to the instrument. In particular, when the source of primary particles is arranged to produce an incident beam at an oblique angle with respect to the sample surface, the area covered by such a beam is greater than when directed normally, and this can lead to excitation of a greater surface area of the sample and consequently a higher secondary particle count rate. Preferably, the incident beam is arranged at a grazing angle of approximately 30°. The above effect is especially exhibited in X-ray photoelectron spectroscopy.

Furthermore, by placing the objective optical axis normal to the sample surface, bright reflections of an illumination source may be avoided when viewing highly reflective samples, such as silicon wafers. Normal optical imaging allows corresponding normal illumination of the sample surface thereby permitting useful visual observations to be made.

Preferably, the objective optical axis is coaxial with the collection axis. Such an arrangement ensures that the area of analysis on a sample located at the analysis area is not affected by errors in the vertical placement of the sample, for example by its supporting stage. A benefit obtainable by arranging the spectrometer with both the objective optical axis and the collection axis in a fixed, coaxial relationship is the increased certainty of correspondence between what is viewed optically (the optical area of analysis) and what is observed spectroscopically (the spectroscopic area of analysis).

Advantageously, there is provided an opening through which the secondary particles are arranged to pass, under the action of the collection lens arrangement. The secondary particles are then able to continue downstream of the opening, disposed about the collection axis, towards a spectroscopic analyser, for example. It is not therefore necessary for the secondary particles to follow a complicated path from a sample under investigation to the analysis stage. Instead, the secondary particles may remain distributed about the collection axis from the sample to the analyser, being collected by the collection lens arrangement and focused towards and through the opening. In this way, it is possible simultaneously to collect and analyse secondary particles from a sample and to receive and view an optical image of that sample, without significantly obstructing the collection of the secondary particles or compromising on the quality of the optical images obtained.

The opening is defined by a hole passing through the optical element. In a preferred embodiment, the opening has a sidewall substantially parallel to the first axis, so that whatever the orientation of the optical element in the chamber, there is a uniform cross-sectional projection of the opening onto a plane perpendicular to the first axis. In this way, the secondary charged particles may pass through substantially the entire opening, without the sidewalls causing 'shadowing'. This is particularly advantageous since high-quality optical elements having diameters suitable for the intended applications generally have thicknesses of 10 mm or more.

Preferably, the light-reflecting optical element is arranged to reflect the image light away from the second axis and out of the collection chamber, for providing a viewable image of the sample surface.

Preferably, a mirror is provided along the objective optical axis to redirect light received from an object at the analysis area away from the objective optical axis, such that the redirected light is disposed about a third imaging optical axis. In this way, optical imaging elements, such as lenses or image recording or displaying apparatus, may be positioned away from the secondary charged particle collection lens arrangement, to minimise any obstruction caused by the optical microscope elements to the secondary charged particles from the sample.

Advantageously, the mirror has a hole in it, which provides the opening. Preferably, the hole in the mirror is elliptical. With the mirror arranged at an oblique angle to the sample surface in use at the analysis area, making the hole elliptical has the advantage that its projection onto a plane coplanar with the analysis area can be made to be circular and sized so as to afford efficient passage to the focused secondary particles through the hole.

Preferably, the mirror is positioned close to an entrance to the spectroscopic analyser, with the benefit that the secondary charged particles then need to travel through a major proportion of the collection chamber, under its focusing influence, before actually reaching the mirror. This has the advantage of providing the collection lens arrangement with a greater distance over which to narrow the secondary particle beam, so that the beam is of relatively small cross-section for passing through the hole in the mirror. In this way, the hole in the mirror may be of relatively small area compared with the total area of the mirror, so that relatively little image intensity is lost. The presence of such a hole in the mirror can be shown to have little effect on the quality of the viewed optical image.

Alternatively, the mirror may be positioned further upstream in the collection chamber. For example, the mirror may be mounted at, or near to, a charged particle optical crossover, such as that formed between two lenses, where the charged particle beam is of a local minimum in diameter.

In a simple collection lens arrangement, there is a single focal point to which the secondary charged particles are directed, usually at the entrance slit to a spectroscopic analyser. Where a more complex lens arrangement is employed, there may be what in optics terminology would be called an intermediate focus: a location of local minimum beam diameter: the (intermediate) charged particle optical crossover. In this specification, the term "charged particle optical crossover" is used to refer to a location at which the beam is at a local minimum in diameter, whether at an intermediate focus in a compound lens arrangement, or a single focus in a simple lens arrangement.

Preferably, the collection lens arrangement and the mirror are provided within a collection chamber, with the microscope's optical imaging elements arranged on a side wall of the chamber, to receive the reflected image light from the mirror. Advantageously, the side wall may comprise an optically transmissive window arranged to transmit the redirected image light out of the chamber. The light may then be focused by multi-element optics, which may be arranged to provide magnification/zoom capability, onto an image displaying and/or recording device, such as a CCD camera.

Advantageously, the window itself may be a lens element. Additionally or alternatively, the mirror may be shaped so as to form a focusing optical element.

Preferably, the microscope includes an illumination source for illuminating the analysis area normally thereto. A partially reflective element, such as a pellicle, mounted at 45° to the optical axis may be positioned between the imaging device and the mirror and arranged to receive light from a light source located off axis. Providing normal illumination increases the quality of the viewed image and avoids or improves on a number of the illumination problems described above.

Preferably, the microscope further comprises a reference pattern generator for use in defining a point of interest within the analysis area. Such a reference pattern may be beneficial in aligning a sample at the analysis area of the spectrometer.

The chamber may be fabricated from many component parts welded together in a conventional manner. Preferably, however, the collection chamber has a monobloc construction. This provides a rigid structure and ensures a vibration-free image and stable alignment may be achieved. This is particularly beneficial in providing good optical performance of the instrument.

According to a further aspect of the present invention, there is provided a method of surface analysis spectroscopy, comprising the steps of: irradiating a surface of a sample, so as to cause emission of secondary charged particles from the surface; collecting at least a proportion of the emitted secondary particles into a collection chamber arranged about a first axis substantially normal to the sample surface; focusing the collected secondary particles along the first axis in a downstream direction using a secondary charged particle lens arrangement, thereby defining a charged particle optical crossover location; receiving, at a light-reflecting optical element positioned downstream of the secondary charged particle lens arrangement and disposed substantially about a second axis substantially normal to the sample surface, image light emitted from the sample surface; and reflecting the received image light away from the second axis for providing a viewable image of the sample surface, wherein the optical element is positioned at, or near to, the charged particle optical crossover location and the optical element comprises an opening therethrough, such that at least a proportion of the focused secondary charged particles pass through the opening for undergoing spectroscopic analysis downstream thereof substantially without obstruction by the optical element.

According to a further aspect of the present invention, there is provided a method of surface analysis spectroscopy, comprising within a collection chamber simultaneously: a) focusing secondary charged particles emitted from a sample surface using a secondary charged particle lens arrangement, the focused secondary charged particles defining a charged particle optical crossover location downstream of the secondary charged particle lens arrangement, and receiving the focused secondary charged particles through an opening disposed substantially about a first axis substantially normal to the sample surface and positioned at, or near to, the charged particle optical crossover location, and spectroscopically analysing the received secondary particles; and b) receiving, about the opening, image light emitted from the sample surface and imaging the received image light for providing a viewable image of the surface.

Other preferred features and advantages are set out in the description and in the dependent claims which are appended hereto.

BRIEF DESCRIPTION OF THE FIGURES

The invention may be put into practice in a number of ways and some embodiments will now be described, by way of non-limiting example only, with reference to the following figures, in which.

DETAILED DESCRIPTION OF EMBODIMENTS

Figure 1:
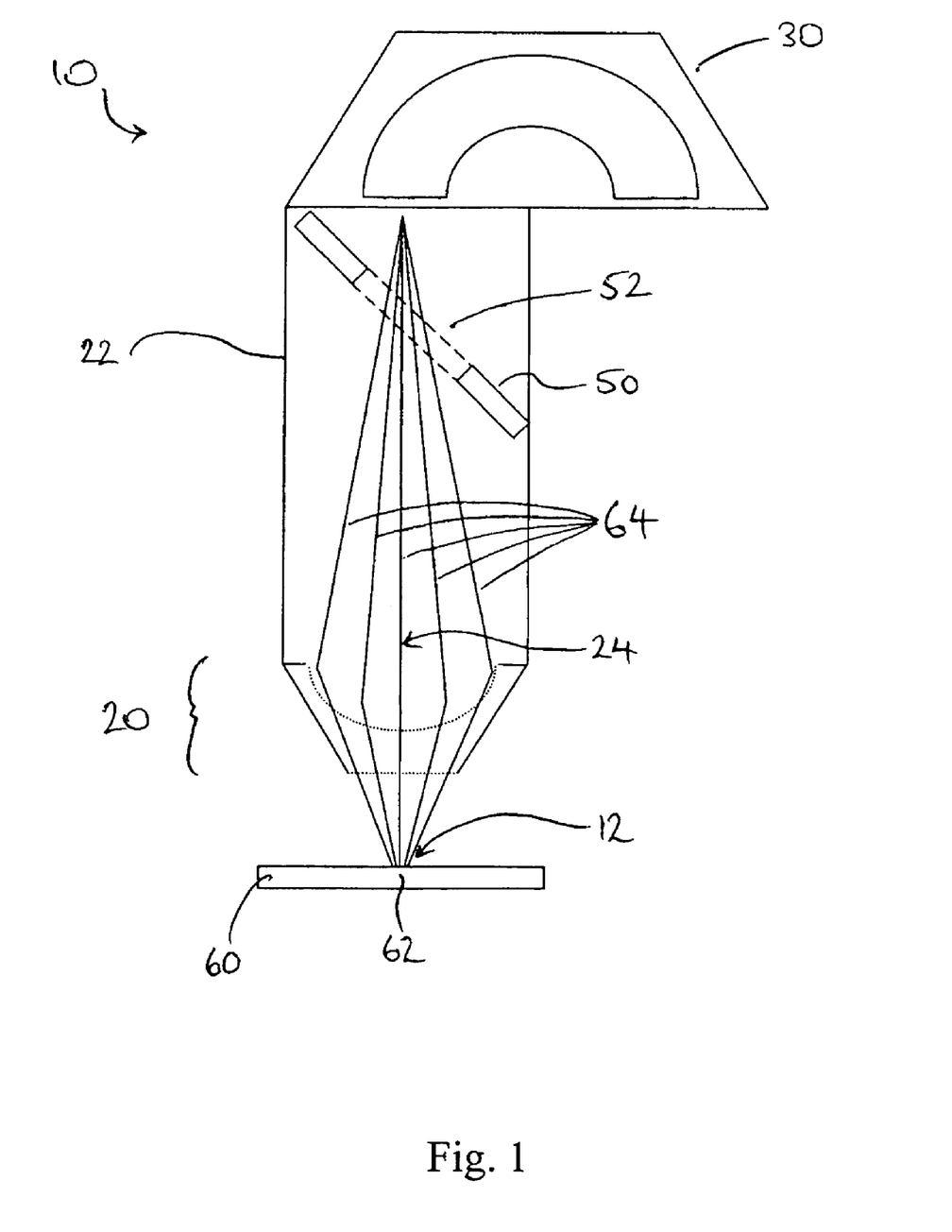
FIG. 1 shows schematically one embodiment of a spectrometer according to the invention and illustrating charged particle trajectories.

Referring to FIG. 1, there is shown a spectrometer 10, suitable for surface analysis of a sample 60. The spectrometer 10 is shown schematically in this embodiment and illustrates exemplary trajectories of secondary charged particles emitted from a surface of the sample 60. The spectrometer 10 comprises a collection lens arrangement 20 arranged in a vacuum collection chamber 22. Although not shown, for clarity, the vacuum collection chamber 22 forms part of a vacuum chamber which also encloses the sample.

The collection lens arrangement 20 is disposed about a collection axis 24 (which happens to be coincident with one of the illustrative charged particle trajectories 64). The collection lens arrangement 20 is located at an end of the collection chamber 22 adjacent to the analysis area 12 of the spectrometer, for reception of secondary charged particles emitted from an area of analysis 62 on the surface of a sample 60 when located at the analysis area, in use.

At the other end of the collection chamber 22 is located a spectroscopic analyser 30. Depending on the application of the spectrometer, the analyser may be arranged to produce either a mass spectrum or an energy spectrum of the secondary particles received therein.

Within the collection chamber 22, towards its downstream end (i.e. near the entrance to the analyser 30), is mounted a mirror 50. The mirror 50 is oriented at an angle of 45° to a normal to the analysis area 12 of the spectrometer 10, for redirecting light out of the collection chamber. The mirror 50 has a hole 52 located approximately towards the centre of the mirror, so as not to obstruct the passage of the secondary charged particles through the collection chamber 22 and into spectroscopic analyser 30.

In use, a primary beam generator (not shown) provides a beam of primary particles at the analysis area 12, for irradiating an area of analysis 62 of a sample 60 located at the analysis area. Irradiation of the sample surface stimulates the emission of secondary particles from the surface, the energies or masses of which are characteristic of the sample under investigation.

For example, in XPS, the sample is irradiated with X-rays, causing the ejection of electrons. The binding energies of these photoelectrons, as measured by the spectroscopic analyser 30, are characteristic of the elements present in the surface and may also provide information about the bonding states of the elements thereby detected. In AES, a focused beam of primary electrons irradiate the sample surface, causing the emission of core electrons from atoms contained on the surface of the sample. The core holes arising from this are filled again by relaxation of the atoms in which electrons with lower binding energies drop down into the holes formed. The energy released by these de-excitation processes results in the emission either of X-rays or of Auger electrons. The energies of these Auger electrons are, again, characteristic of the elements from which they derive and can thus be used to identify the elements present in the surface of the sample.

The secondary charged particles emitted from the sample 60 are collected into the collection chamber 22 under the influence of the collection lens arrangement 20. The collection lens arrangement 20 may be of any design. For example, this could be an electrostatic lens formed by a discrete electrode design. Alternatively, the electrostatic lens could be provided by curved meshes. Alternatively still, the collections lens arrangement 20 could use magnetic lenses, mounted above or below the analysis area 12. Combinations of the above lens types are also possible. In the preferred embodiment, the lens is a multi-element arrangement, using electrostatic and/or magnetic lens elements. Such lens designs are well known in the art.

The collection lens arrangement 20 collects the secondary charged particles into the collection chamber 22 and causes the particles to converge, so that they are able to pass through the hole 52 in the mirror 50 and on to the spectroscopic analyser 30. The converging effect of the collection lens arrangement 20 may be such that the secondary particles are focused to or towards a point, either within the collection chamber 22 or the analyser 30. Alternatively, the converging effect may be such that the secondary particles are collimated into a narrow enough beam for passage through the hole 52 in the mirror 50. It is an advantage of the invention that guiding or controlling the secondary particles in any of these ways through the collection chamber 22 and into the analyser 30 does not significantly impair the collection efficiency of the spectrometer 10.

FIG. 1 shows an example in which the secondary particles are emitted with a wide range of angles from the area of analysis 62 of the sample. The emitted particles are disposed generally about the collection axis 24, which is normal to the analysis area 12 and therefore normal to the area of analysis 62 of the sample 60 which is located at the analysis area. At least a proportion of the secondary particles emitted from the surface are collected by the collection lens arrangement 20, which in this embodiment focuses them towards a point on the collection axis 24 at a downstream end of the collection chamber 22. It is noted that substantially all of the secondary particles received into the collection chamber 22 are directed through the hole 52 in the mirror 50 and onto the analyser 30.

A wide variety of analysers known in the art may be used as the spectroscopic analyser 30. For example, in energy analysis and in particular XPS or AES, the analyser 30 may be either a toroidal electrostatic analyser or an electrostatic cylindrical mirror analyser, or the analyser may be a time-of-flight analyser, especially for SIMS applications. However, any energy or mass analyser may be used, depending on the application.

Figure 2:
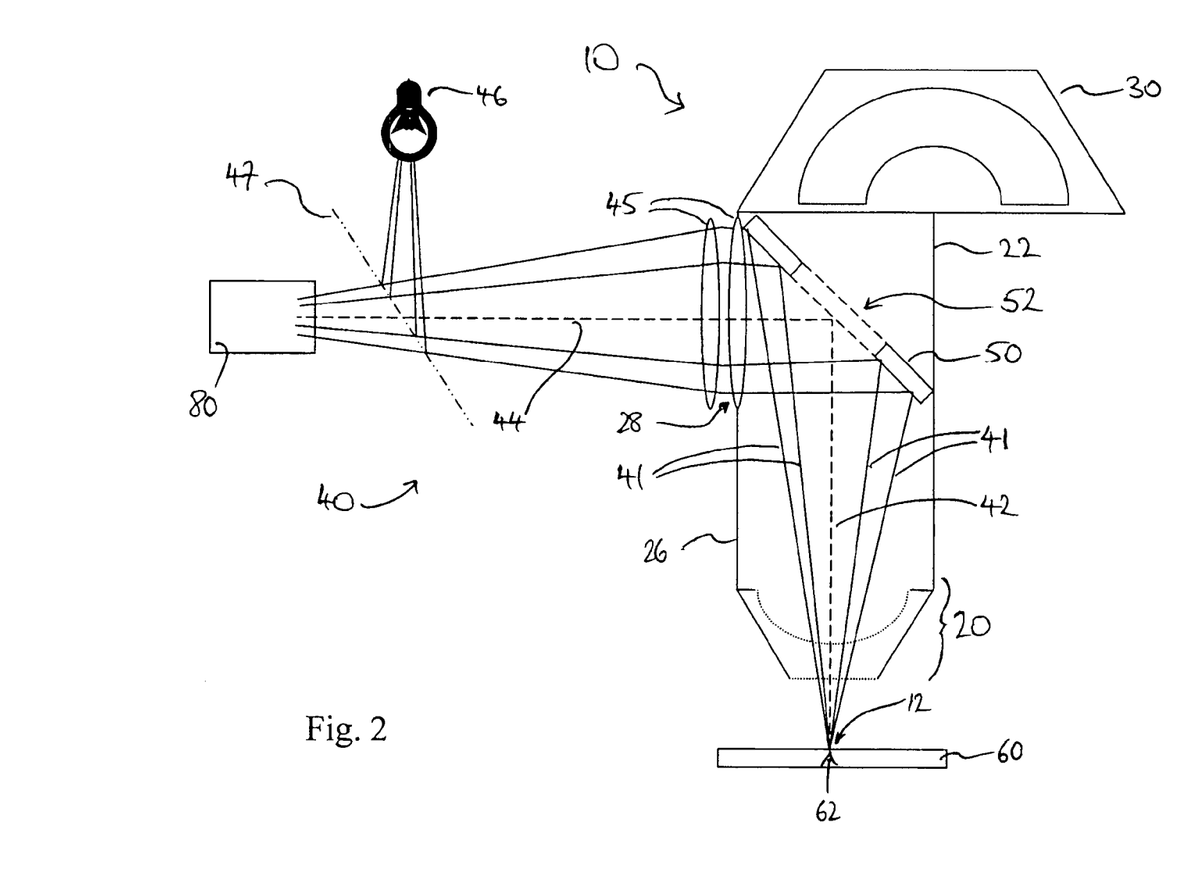
FIG. 2 shows schematically one embodiment of a spectrometer according to the invention and illustrating the optical microscope and light rays passing therethrough.

FIG. 2 shows a spectrometer 10, comprising a collection lens arrangement 20 provided in a collection chamber 22, at a first end adjacent an analysis area 12 of the spectrometer, a spectroscopic analyser 30 located at the other, downstream end of the collection chamber 22, and a mirror 50 having a hole 52 therein mounted towards the downstream end of the collection chamber, as in FIG. 1. The spectrometer 10 includes an optical microscope 40, which is disposed about two optical axes in this embodiment. An objective optical axis 42 extends normally from the analysis area 12 to the mirror 50, which is mounted at a 45° angle to the objective optical axis. In this embodiment, the mirror 50 is centred on the objective optical axis 42. Extending from the centre of the mirror 50, perpendicularly to the objective optical axis 42, is an imaging optical axis 44. Disposed along the imaging optical axis 44 are two imaging lenses 45—although only one, or more, imaging lens may alternatively be used—and an optical imaging device 80, such as a CCD camera. Also disposed on the imaging optical axis 44, between the imaging device 80 and the mirror 50 is a partially reflective and partially transmissive element or pellicle 47, which is mounted at 45° to the imaging optical axis. A light source 46 is provided perpendicularly to the imaging optical axis 44 and aligned with the pellicle 47.

The collection chamber 22 is provided with a vacuum optical window 28, which is optically transmissive, so as to allow light to pass out of the collection chamber therethrough. In this embodiment, although not necessarily so, the vacuum optical window 28 provided in the side wall 26 of the collection chamber 22 is itself an optical lens element 45. This has the benefit of reducing the number of optical components in the microscope, thereby reducing cost and complexity.

In use, image light rays 41 emanating from an object at the analysis area 12, such as an area of analysis 62 of a sample 60, enter the collection chamber 22 through its entrance aperture and travel towards the mirror 50, the rays being generally disposed about the objective optical axis 42. Broadly speaking, the light rays 41 reaching the mirror 50 are reflected in a direction generally perpendicular to the objective optical axis 42, so that the reflected light rays 41 are then disposed generally about the imaging optical axis 44.

The reflected light rays 41 pass out of the collection chamber 22 through the vacuum optical window 28. The light rays 41 are then focused using a multi-element lens system towards the imaging device 80. The lens elements 45 employ high-quality glass optics, such as that manufactured by Linos Photonics Ltd. of Milton Keynes, Buckinghamshire, United Kingdom. The optical lens system between the mirror 50 and the imaging device 80 may, in some embodiments, incorporate a zoom capability.

The imaging device 80 may be a simple eyepiece or may be a CCD camera, such as that manufactured by Panasonic of Bracknell, Berkshire, United Kingdom. The imaging device 80 may be arranged to display a received image or images in real time on an associated display screen, preferably as part of the data system display on a computer monitor, or may record the images for subsequent viewing. Preferably, the images will be viewed concurrently with the collection of spectral data from the spectroscopic analyser 30.

In the embodiments shown, although not necessarily so, a light source 46 is provided to illuminate the sample 60 at the analysis area 12 normally thereto. Using the pellicle 47, a proportion of the illumination light received from the light source 46 is reflected towards the mirror 50, which in turn reflects the light towards the analysis area 12 to provide normal illumination to an object located there. Because the pellicle 47 is partially reflective and partially transmissive, at least a proportion of the image light 41 travelling from the collection chamber 22 towards the imaging device 80 is transmitted through the pellicle 47, so that a viewable image of the sample surface at the analysis area 12 may be obtained.

With this optical microscope 40, a point of interest on the surface of a sample 60 placed at the analysis area 12 of the spectrometer 10 may be selected for spectral observation of secondary particles emitted from that point of interest using the spectrometer. The sample 60 may be mounted on a supporting and movable stage (not shown), so that the sample may be translated, rotated or tilted to a desired analysis orientation. For optimum performance of the spectrometer, the objective optical axis 42 and the collection axis 24 are arranged coaxially, so that once a desired position on a sample 60 has been selected, it is ensured that the spectral observations subsequently made are indeed of that point of interest on the sample.

Figure 3:
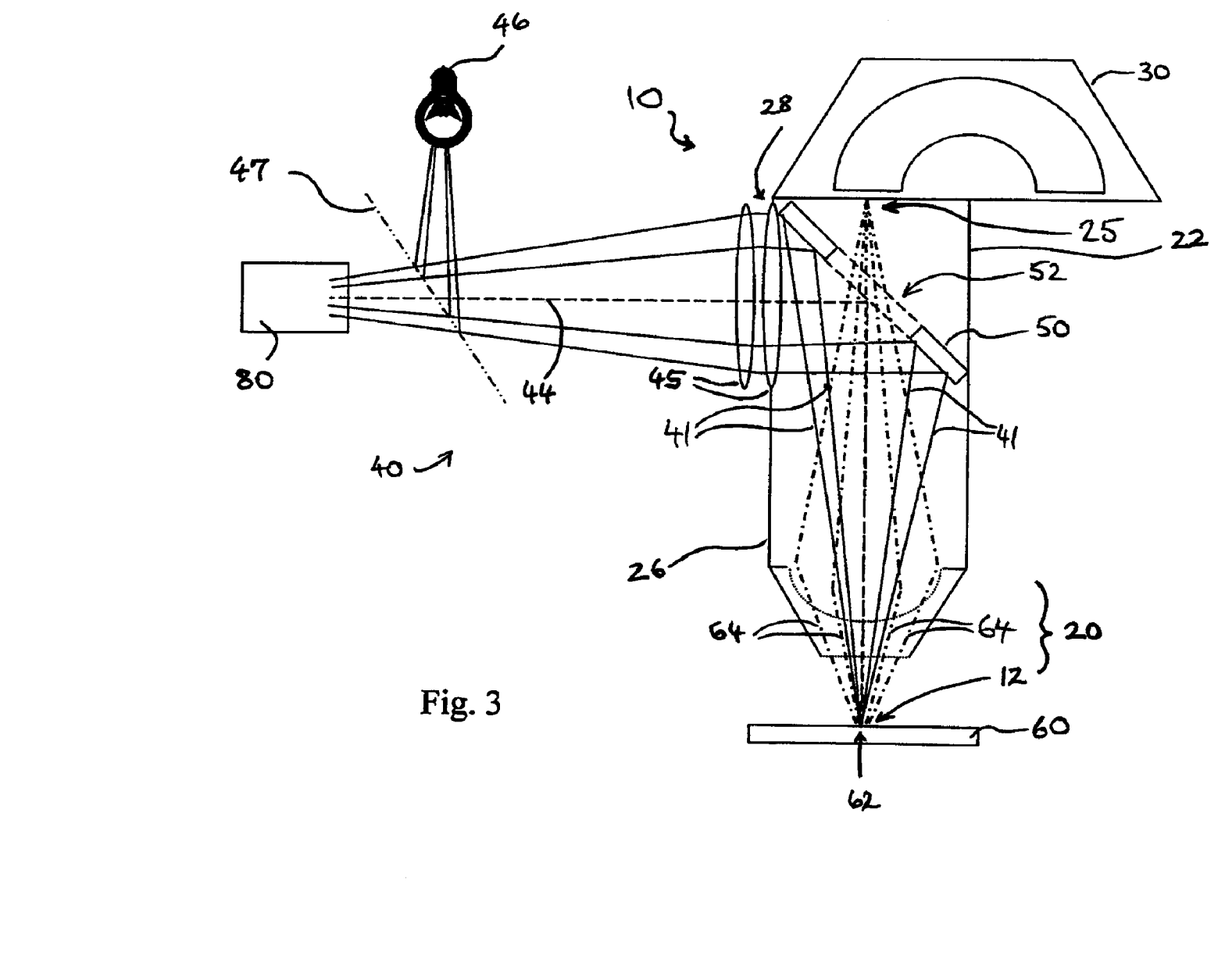
FIG. 3 shows schematically one embodiment of a spectrometer according to the invention and illustrating both secondary particle trajectories and image light rays.

FIG. 3 shows schematically a spectrometer 10 similar to that in FIG. 2, but illustrating an embodiment in which both spectral observations and optical viewing of a sample 60 are being made simultaneously. Providing the optical lenses 45 and other optical elements after/downstream of the mirror 50 means that these components are out of the way of the secondary charged particles travelling through the collection chamber 22. Thus, it is possible to view optically the sample 60 placed at the analysis area 12 with the optical microscope 40, while efficiently collecting the secondary charged particles into the spectroscopic analyser 30, since loss of or obstruction to the charged particles is avoided.

In the embodiment shown in FIG. 3, the objective optical axis 42 is coaxial with the collection axis 24, both of which being normal to the analysis area 12 of the spectrometer 10. The hole 52 in the mirror 50 is generally centred about the collection axis 24, so that the secondary charged particles may be focused and/or collimated about that axis to pass through the hole. Coaxial, normal viewing of the surface of a sample 60 and normal collection of secondary charged particles from that surface is the preferred embodiment of the invention, as this simplifies the set-up of the spectrometer 10 and, in use, increases the certainty of correspondence between the location from which optical image originates and the location from which the secondary charged particles are emitted.

In FIG. 3, the mirror 50 is located close to the crossover location 25 at the input slit to the analyser 30, so that the secondary charged particles may pass through the hole 52 in the mirror without obstruction or deflection and the image light rays may be reflected by the part of the mirror surrounding the hole. The presence of the hole 52 in the mirror 50 can be shown to have little effect on the quality of the optical image obtained by the optical microscope 40. If the mirror 50 is mounted at, or near to, a location where the charged particle beam is of small cross-section—typically near to the charged particle optical crossover 25—then the hole 52 may be of small area compared to the total area of the mirror, so that relatively little image intensity is lost. Preferably, the mirror is close to the entrance to the spectroscopic analyser 30, especially when the crossover is at or near the entrance slit to the analyser. However, where the crossover is upstream of the analyser, the mirror may be located anywhere between the crossover location 25 and the entrance to the analyser. Indeed, the mirror may be located still further upstream in the collection chamber if desired, although it is preferable to provide a relatively large distance between the sample and the mirror, over which distance the secondary particles may be focused and/or collimated to pass through the hole in the mirror.

Figures 4A, 4B:
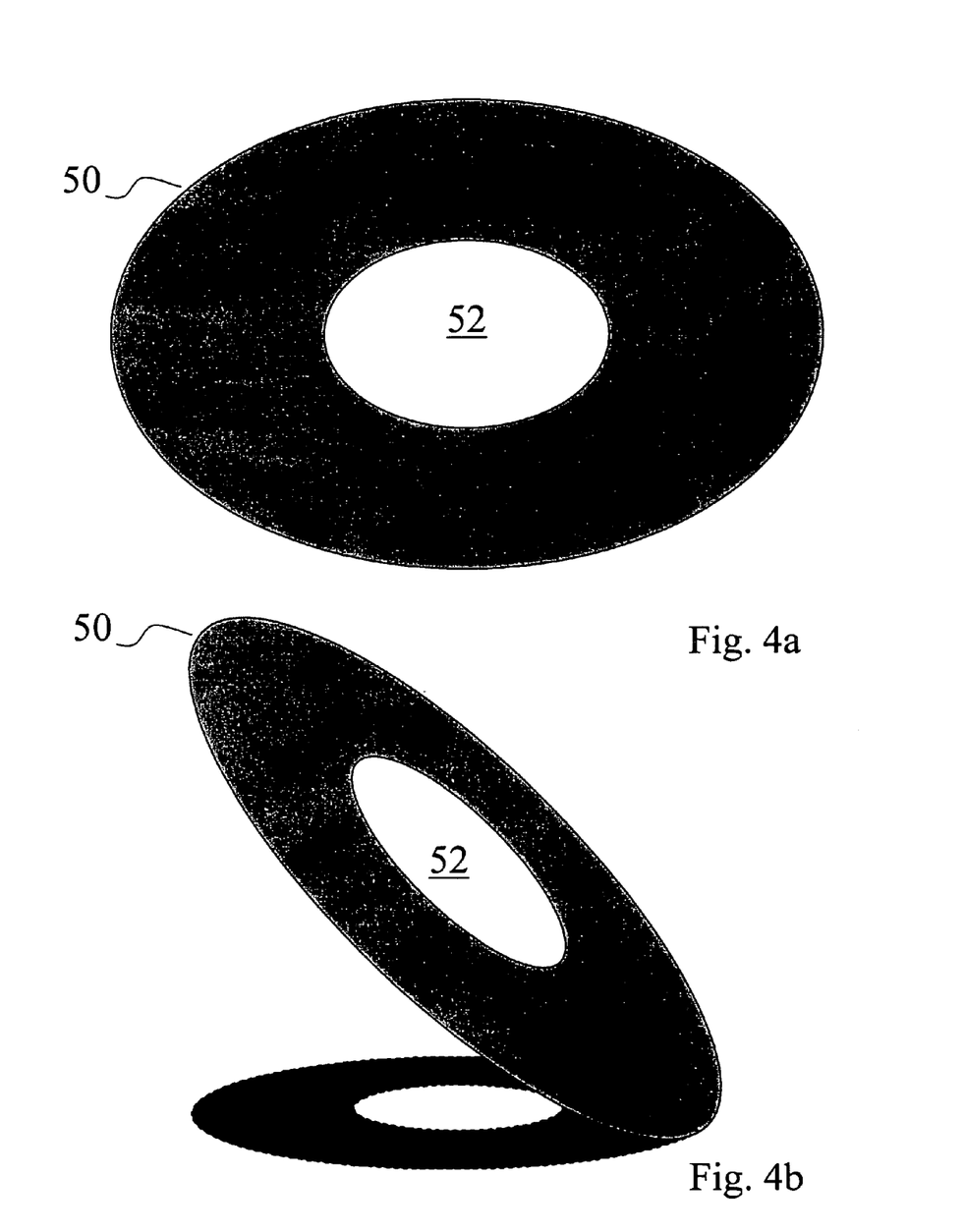
FIGS. 4a and 4b show schematically a plan view and a perspective view respectively of one embodiment of an optical mirror according to the invention.

FIGS. 4a and 4b show schematically plan and perspective views respectively of the mirror 50 according to one embodiment of the invention. In this embodiment, the mirror 50 is elliptical in shape. The hole 52 is also elliptical in shape and is centred with respect to the mirror 50. The mirror is preferably manufactured with an ellipse of major and minor axes having a ratio of 1:1.414 to give a circular projection at 45 degrees. The mirror 50 has a major axis of 141 mm and a minor axis of 100 mm. In this embodiment, the hole 52 is mathematically similar to the shape of the mirror 50, i.e. in proportion therewith, and has a major axis of 56 mm and a minor axis of 40 mm. Of course, a range of shapes and sizes for the mirror 50 and its hole 52, respectively, may be selected, such as square, rectangular, polygonal, or circular, but the above dimensions are the currently preferred embodiment of the invention. Making the mirror 50 and hole 52 elliptical in shape has the advantage that, when the mirror is centred about an axis and mounted obliquely thereto, a projection of the mirror and hole onto a plane perpendicular to that axis can be arranged to be generally circular or annular. Thus, when the hole 52 is centred on the collection axis 24, passage of the secondary charged particles through the hole may be facilitated, since the most straightforward cross-sectional form for the focused and/or collimated secondary particle beam is circular. Such an arrangement is generally shown FIG. 4b.

For example, mounting an elliptical mirror 50 having the above dimensions with its major axis at an angle of 45° to an axis passing the through the centre of the hole 52 (such as the collection axis 24 and/or the objective optical axis 42) gives rise to the following approximate projected dimensions:

Mirror length and width: 100 mm

Hole length and width: 40 mm

In both cases, either when taken in the plane of the mirror 50 or when taken in the projected plane of the mirror, the percentage of the area occupied by the hole 52 from the overall area of the mirror 50 is approximately 16%. This percentage is not considered to be significant to the image intensity. In fact, it is considered acceptable for the hole 52 to occupy a much larger area of the mirror, providing the achievable image intensity is high enough for viewing. The hole in the mirror has virtually no effect on the optical quality of the viewed image; only on its intensity.

Conversely, based on modelling of the optics of the charged particles using SIMION software, it can be shown that in this embodiment the diameter of the hole 52 should be greater than approximately 30 mm and preferably approximately 40 mm or greater.

The distances over which the secondary charged particles are focused and/or collimated down to the size of the hole 52 in the mirror 50 are relatively large through collection chamber 22, so relatively low potentials may be applied to the collection lens arrangement 20 in order to direct the secondary particles through the hole. The potentials applied to the collection lens arrangement 20 are proportional to the energy of the particles being analysed. Typically, the voltages will be up to 4000 volts.

Taking now the mirror 50 to be centred on the imaging optical axis 44 and mounted at an angle of 45° thereto, the projection of the mirror onto a plane perpendicular to that axis will also have a length of approximately 100 mm, using the above dimensions. The diameter of the vacuum optical window 28 and lens elements 45 is preferably also in the region of 100 mm, so that a relatively high proportion of the light reflected by the mirror 50 towards the window 28 may be transmitted therethrough and onto imaging device 80.

The mirror 50 may be of metallic or of reflectively coated glass construction. In either case, conductive coatings, baffles, meshes or other means should be provided at the mirror 50, to prevent electrically insulating surfaces of the mirror from becoming charged and interfering with the trajectory of the secondary charged particles, by deflecting them away from the hole 52. Such considerations are known in the art.

Preferably, the mirror is flat and planar. However, in some embodiments in which it is desired that the mirror 50 also perform the function of a focusing optical element, the mirror may be ground or machined to a conic surface. Such large-area optics, of sufficiently high quality, have recently become available for this use. For example, mirrors with off-axis parabolic and conical sections are widely used for deflecting and focusing laser beams, and are manufactured for example by II-IV Infrared of Pennsylvania, USA.

In FIGS. 1 to 3, the side wall defining the hole 52 in the mirror 50 is shown to extend perpendicularly from either surface of the mirror. Such an orientation of the side wall facilitates the machining of the hole 52 and is for that reason advantageous. However, in the currently preferred embodiment, the hole is bored through the mirror such that the side wall formed extends substantially parallel to the collection axis 24. In this arrangement, a collimated secondary particle beam could occupy substantially the entire opening defined by the hole 52. Alternatively still, the side wall defining the opening 52 may be formed so as to slope inwardly in a downstream direction, such that the area of the opening at the light-reflecting surface of the mirror 50 is larger than the area of the opening on the opposite, dark side of the mirror. Such an arrangement may be beneficial for secondary charged particle beams which are focused towards to a point downstream of the hole 52, as the beam will have generally cone-shaped form. Other arrangements of the side wall and hole 52 will be apparent to the skilled reader.

The embodiments of the mirror 50 according to the invention described above may be particularly advantageous when the collection lens arrangement 20 incorporates one or more lenses of mesh construction. Such lenses are able to provide high collection efficiency, while permitting good optical viewing of the surface of a sample 60 at the analysis area 12. Perhaps surprisingly, the presence of meshes in the optical path has been found to cause little degradation in the optical image quality, since the location of the meshes is well removed from any focal plane of the optical microscope 40.

Figure 5:
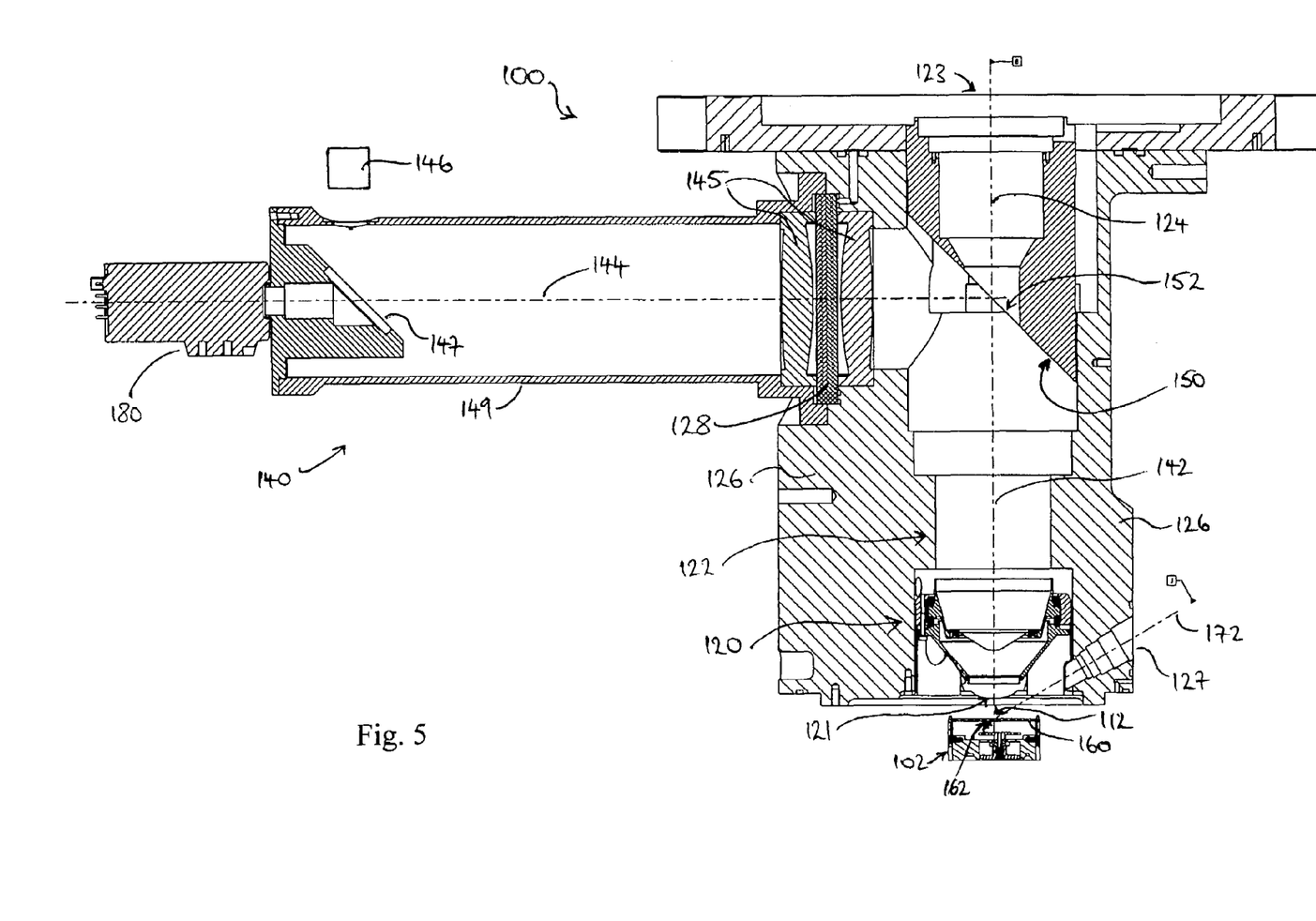
FIG. 5 shows a cross-sectional view of another embodiment of a spectrometer according to the invention and intended for use in X-ray photoelectron spectroscopy.

FIG. 5 shows a cross-sectional view of a further embodiment of a spectrometer 100 according to the invention, the spectrometer being arranged to perform X-ray photoelectron spectroscopy. For XPS applications, the arrangement shown in FIG. 5 represents the currently preferred embodiment of the invention.

The spectrometer 100 includes a generally elongate vacuum collection chamber, or column, 122, which is evacuated by one or more pumps (not shown). The collection chamber 122 is generally cylindrical in form and centred about a collection axis 124, which runs throughout the chamber from an entrance aperture 121 to an exit aperture 123.

The entrance aperture 121 is located above a sample support stage assembly 102, which is capable of being translated in the X-, Y- and Z-directions and of being rotated or tilted about respective rotation and tilt axes (not shown). The sample support stage assembly 102 provides a surface on which a sample 160 may be held, for spectroscopic investigation. The side wall 126 of the collection chamber 122 includes an elongate opening 127 therethrough, centred about a primary beam axis 172, which axis is angled obliquely to the collection axis 124 and intersects that axis at or near the sample support stage assembly 102. A region generally perpendicular to the collection axis 124 at this intersection may be defined as the analysis area 112 of the spectrometer 100.

Provided externally of the collection chamber 122, along the primary beam axis 172, is an X-ray beam generator (not shown). The X-ray beam generator is arranged to provide a directed beam of X-rays at the analysis area 112 of the spectrometer 100.

At a downstream end of the collection chamber 122, the exit aperture 123 leads into a spectroscopic analyser (not shown) arranged to record energy spectra of secondary photoelectrons received from the collection chamber 122.

Provided in the collection chamber 122 towards the entrance aperture end is an electron collection lens arrangement 120, in the form of an electrostatic mesh lens. In its simplest form, as shown in FIG. 5, the electrostatic mesh lens is the only collection lens used. However, in further embodiments, there may be additional lens elements included.

Aligned coaxially with the collection axis 124, normal to the analysis area 112 of the spectrometer 100, is an objective optical axis 142. Mounted about the two axes 124, 142 is a mirror 150, oriented at an angle of approximately 45° thereto. As before, the mirror includes a hole 152 disposed centrally in relation to the mirror.

Intersecting the collection axis 124 and objective optical axis 142 at the hole 152 in the mirror 150 is an imaging optical axis 144, extending perpendicularly to the other two axes.

Disposed about the imaging optical axis 144 is a microscope tube 149, optical lens elements 145 and CCD camera 180, which together with the mirror 150 form an optical microscope 140.

The side wall 126 of the collection chamber 122, on a side opposite that containing the primary beam opening 127, includes an optically transmissive window 128, which is provided with a vacuum seal to the side wall in a known manner. The microscope tube 149 is attached to the side wall 126 externally of and surrounding the window 128.

In this embodiment, an optical lens element 145 is positioned on either side of the window 128 and these are arranged to receive and focus image light reflected from the mirror 150 towards the CCD camera 180. The diameter of the optical lens element 145 is substantially the same as the height of a vertical projection of the mirror 150 (i.e. a projection of the mirror onto a plane perpendicular to the imaging optical axis 144). In this way, a high proportion of the light reflected by the mirror may be received by the lens element 145 and transmitted towards the CCD camera 180.

Disposed within the microscope tube 149, between the CCD camera 180 and the lens elements 145, is a pellicle 147. The pellicle is mounted about the imaging optical axis 144 at an angle of 45° thereto. The pellicle 147 is an extremely thin, transparent film, in this embodiment used as a semi-reflector, without causing double reflections. A light source 146, mounted externally of the microscope tube 149 provides illumination light to the analysis area 112 of the spectrometer 100, via a window in the microscope tube 149 above the pellicle 147, which reflects a proportion of the light along the imaging optical axis 144 towards the optical lens elements 145 and through the optically transmissive window 128, onto the mirror 150, which reflects the illumination light downwards towards the analysis area.

The functioning of the spectrometer 100 is similar to that described with respect to the preceding figures, but specifically for which the primary beam is provided by X-ray photons and the secondary charged particles are photoelectrons.

In a preferred embodiment of the spectrometer 100, the chamber is manufactured as a rigid, 'monobloc' construction (i.e., integrally cast or machined, to form a single finished component), rather than being fabricated and welded from many component parts in the traditional way. This makes the structure very rigid and ensures vibration-free operation and stable alignment of the spectrometer. While manufacturing the chamber from component parts is an alternative, the monobloc construction does enhance the performance of the spectrometer and resulting image quality and is therefore preferred.

In some embodiments, it may be desirable to provide a visual reference within the optical microscope 140, to assist a user in defining a point of interest on the surface of a sample 160 located at the analysis area 112 of the spectrometer 100. This may be provided by a reticule, also known as a graticule, which is a cell containing cross-hairs and placed near the eyepiece or viewing end of the microscope 140. Alternatively, a separate light source incorporating a pattern generator such as cross-hairs, concentric rings or an array of spots, may be integrated with the microscope optics.

It will be apparent to the skilled reader that the invention provides a number of advantages. Providing the mirror towards a downstream end of the collection chamber provides the main advantage of a relatively clear tube (free from obstructions), within which the secondary charged particles emitted from a surface of sample may be focused and/or collimated. Thus, the obstruction caused by the mirror in the collection chamber is relatively small, since by the time the secondary particles reach the mirror they will have already been formed into a narrow or narrowing beam which is able to pass through the hole in the mirror. As will be understood, the range of energies of the secondary particles emitted from a sample in surface analysis spectroscopy can be relatively large, so it is highly desirable to be able to provide a relatively large distance over which the secondary particles may be controlled by the collection lens arrangement, before encountering any optical components such as the mirror.

It will be understood by the skilled person that any possible and desirable combination(s) of teachings from the above description forms part of the invention and is intended to fall within the scope of the appended claims. In addition, various modifications and/or alterations of the embodiments described above will become apparent to those skilled in the art and these are also intended to form part of the invention.

Figure 6:
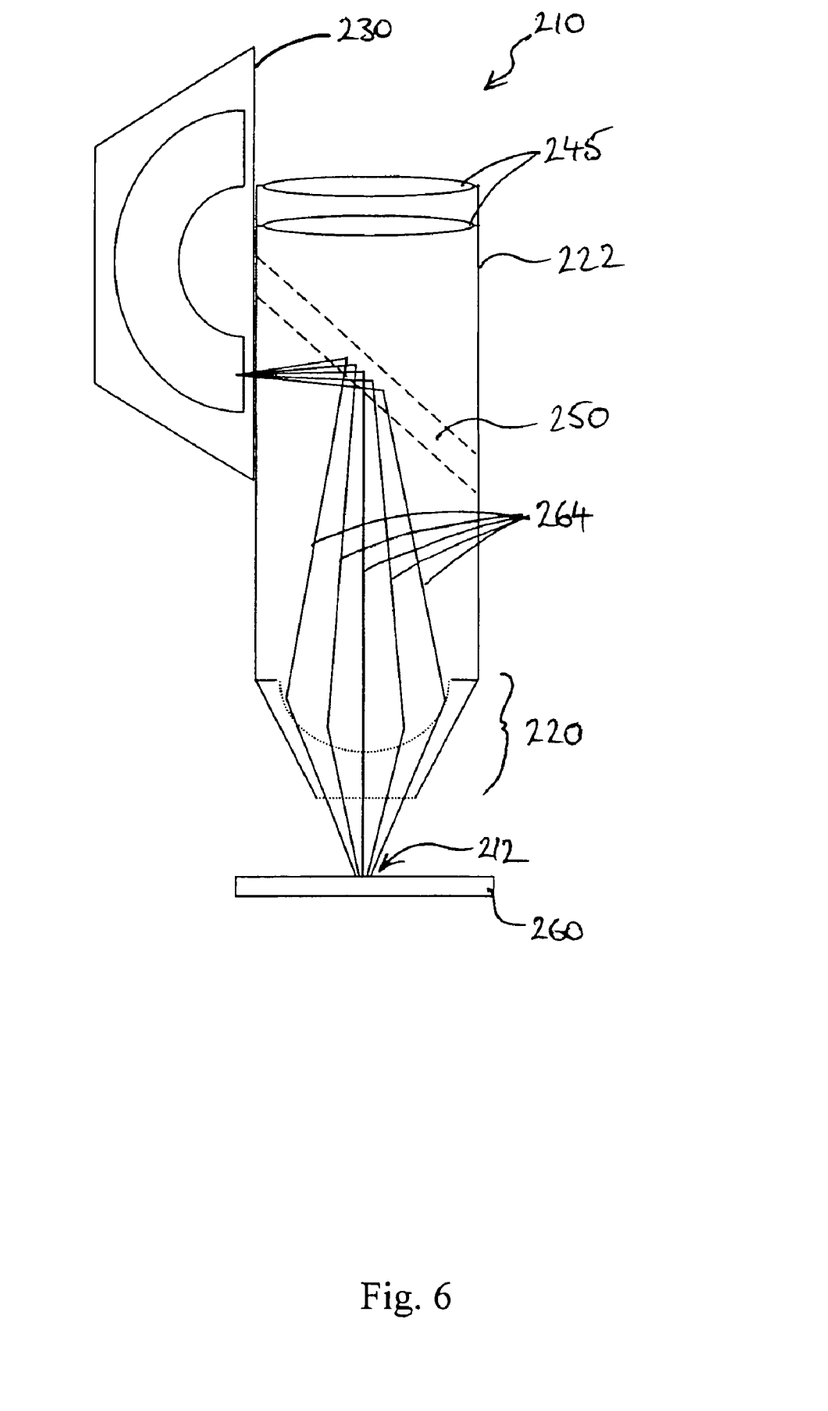
FIG. 6 shows schematically a further embodiment of a spectrometer according to the invention and illustrating charged particle trajectories.
Figure 7:
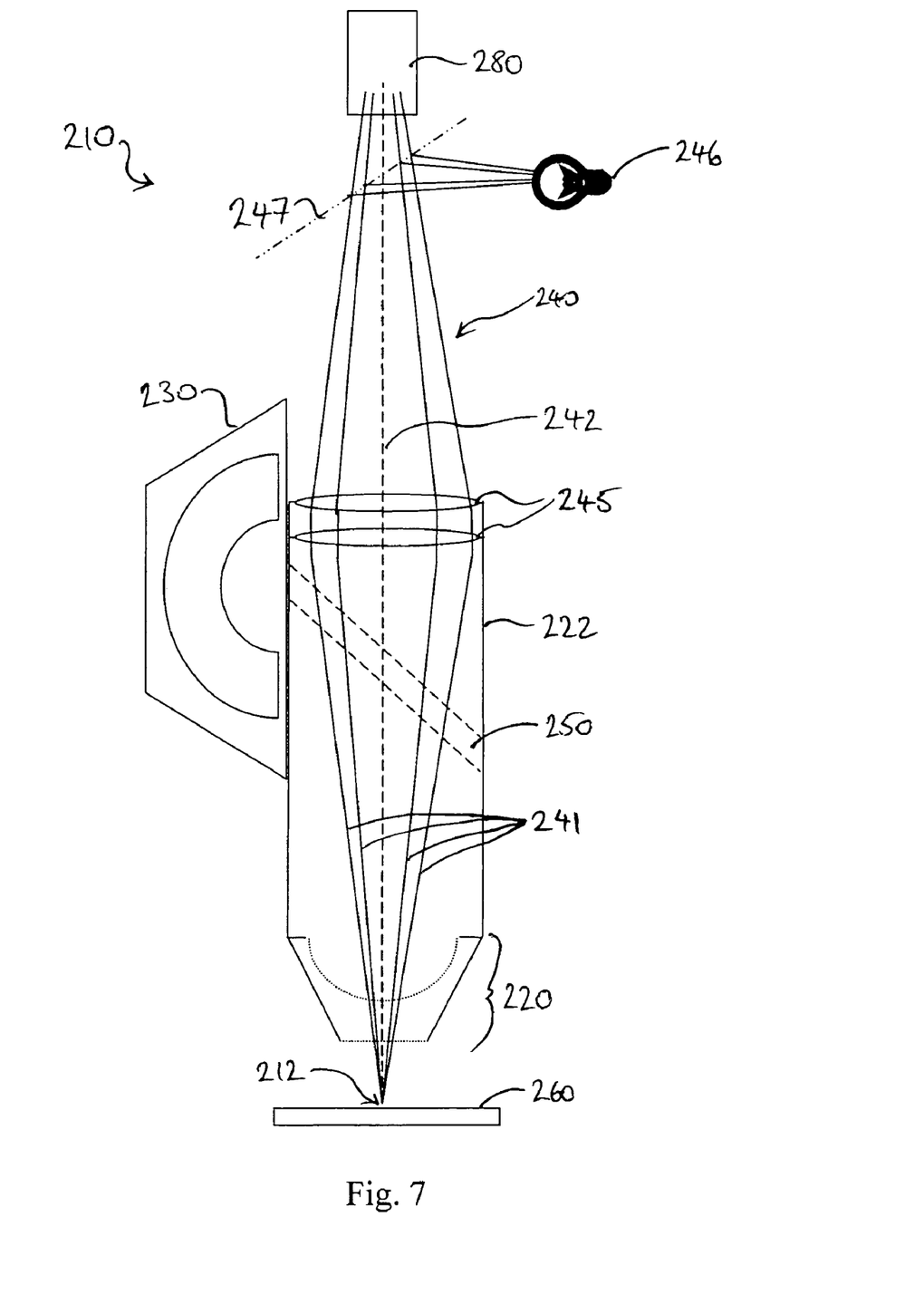
FIG. 7 shows schematically a further embodiment of a spectrometer according to the invention and illustrating light ray trajectories.

For example, the above embodiments have described spectrometer arrangements in which i) the secondary charged particles are focused/collimated along the collection axis 24, 124 which extends along and through the collection chamber 22, 122 normal to the analysis area, and ii) the image light is redirected from the objective optical axis 42, 142 which also extends along and through the collection chamber 22, 122 normal to the analysis area to the imaging optical axis 44, 144 which is perpendicular to the objective optical axis. A further embodiment of the invention, shown in FIGS. 6 and 7, deflects the secondary particles off axis for spectroscopic analysis and keeps the image light along the axis of the collection chamber. This alternative arrangement still provides the advantages associated with both receiving image light emanating from the sample surface by an optical element normal to the surface, and receiving/controlling secondary charged particles emanating from the surface by a charged particle lens arrangement normal to the surface.

In this embodiment, instead of diverting the image light and having the secondary particles passing into an analyser on the collection axis, the objective optical axis 242 is normal to the analysis area 212 and runs to a CCD camera 280 or an eyepiece located above the sample 260. There is an electrostatic mesh-style charged particle mirror 250 disposed along the axis to deflect the secondary charged particles off axis towards an analyser 230 which is now located generally where the optical microscope 40, 140 is in FIGS. 2 and 5. Essentially, the positions of the optical camera and the spectroscopic analyser are swapped in this embodiment. Instead of, for example, using an optical mirror with a hole through it to reflect light off axis and pass charged particles along the axis, voltages are applied to the mesh mirror 250 to deflect the secondary charged particles off axis and into an input slit of the analyser 230, while permitting image light to pass through it and along the axis 242. The preferred structure for the charged particle mirror 250 is an electrostatic mesh, which does not interfere with the passage of the light through the mirror. The position and focal length of the optical lens assembly 245 may be chosen to provide any required magnification. Coaxial illumination may be provided by a light source 246 and pellicle 247. Other light sources may be provided as required.

In the above embodiments, it is currently preferred for the collection axis 24, 124, 224 to be coaxial with the objective optical axis 42, 142, 242. However, the advantages of the invention may still be provided if there is a small angle, or a small lateral separation, between these axes. Where there is a small angle, preferably the axes intersect at the sample so that the observed secondary particles and image light both emanate from the same location on the sample. Accordingly, configurations in which the charged particle lens arrangement, for receiving the secondary charged particles, and the optical element, for receiving the image light, are disposed substantially about the same axis are intended to be included within the scope of the invention.

The invention claimed is:

1. A spectrometer for surface analysis of a sample by irradiation of the sample surface by primary particles, the spectrometer comprising:

a collection chamber for receiving secondary charged particles and image light from the sample surface, the collection chamber having a first axis in use substantially normal to the sample surface, the collection chamber comprising:

a secondary charged particle lens arrangement arranged to focus at least a proportion of the emitted secondary charged particles in a downstream direction along the first axis and thereby to define a charged particle optical crossover location; and a light-reflecting optical element positioned downstream of the secondary charged particle lens arrangement and having a second axis in use substantially normal to the sample surface, the optical element being arranged to receive image light from the sample surface and to reflect that light away from the second axis for providing a viewable image of the sample surface, wherein the optical element is positioned at, or near to, the charged particle optical crossover location and the optical element comprises an opening therethrough, such that at least a proportion of the focused secondary charged particles may pass through the opening for undergoing spectroscopic analysis downstream thereof substantially without obstruction by the optical element.

2. The spectrometer of claim 1, wherein the light-reflecting optical element is arranged to receive image light directly from the sample surface.

3. The spectrometer of claim 1, wherein the opening is defined by a sidewall substantially parallel to the first axis.

4. The spectrometer of claim 1, wherein the optical element is a mirror.

5. The spectrometer of claim 4, further comprising an optical microscope comprising the mirror and having a third imaging optical axis non-parallel with the second axis, wherein the mirror is arranged to redirect image light originating from the surface of the sample away from the second axis such that the said light is disposed about the third axis.

6. The spectrometer of claim 1, wherein the opening is elliptical.

7. The spectrometer of claim 5, wherein the collection chamber has a sidewall comprising an optically transmissive window disposed substantially about the third imaging optical axis, such that the mirror may redirect the image light out of the chamber through the window.

8. The spectrometer of claim 7, wherein the window is an optical lens element.

9. The spectrometer of claim 4, wherein the mirror is shaped to act as a focusing element.

10. The spectrometer of claim 5, wherein the optical microscope further comprises:
   a light source for providing illuminating light to the sample surface; and
   a partially reflective element disposed obliquely with respect to the imaging optical axis and arranged to receive illuminating light from the light source and redirect the illuminating light towards the mirror, such that substantially normal illumination may be provided to the sample surface.

11. The spectrometer of claim 5, wherein the microscope further comprises a reference pattern generator for use in defining a point of interest at the sample surface.

12. The spectrometer of claim 1, wherein the collection chamber has a monobloc construction.

13. The spectrometer of claim 1, arranged to be simultaneously capable of:
   a) the collection lens arrangement focusing the said secondary charged particles towards the opening for downstream processing, and
   b) the optical element receiving image light from the surface of the sample for providing a viewable image of the surface.

14. The spectrometer of claim 1, further comprising:
   a source of primary particles for providing irradiation to the sample surface; and
   a spectroscopic analyser downstream of the opening and arranged to receive therefrom secondary charged particles for spectroscopic energy analysis or spectroscopic mass analysis thereof.

15. The spectrometer of claim 1, wherein the first and second axes are substantially coincident.

16. A method of surface analysis spectroscopy, comprising the steps of:
   irradiating a surface of a sample, so as to cause emission of secondary charged particles from the surface;
   collecting at least a proportion of the emitted secondary particles into a collection chamber arranged about a first axis substantially normal to the sample surface;
   focusing the collected secondary particles along the first axis in a downstream direction using a secondary charged particle lens arrangement, thereby defining a charged particle optical crossover location;
   receiving, at a light-reflecting optical element positioned downstream of the secondary charged particle lens arrangement and disposed substantially about a second axis substantially normal to the sample surface, image light emitted from the sample surface; and
   reflecting the received image light away from the second axis for providing a viewable image of the sample surface, wherein the optical element is positioned at, or near to, the charged particle optical crossover location and the optical element comprises an opening therethrough, such that at least a proportion of the focused secondary charged particles pass through the opening for undergoing spectroscopic analysis downstream thereof substantially without obstruction by the optical element.

17. The method of claim 16, wherein the image light is received directly from the sample surface.

18. A method of surface analysis spectroscopy, comprising within a collection chamber simultaneously:
   a) focusing secondary charged particles emitted from a sample surface using a secondary charged particle lens arrangement, the focused secondary charged particles defining a charged particle optical crossover location downstream of the secondary charged particle lens arrangement, and receiving the focused secondary charged particles through an opening disposed substantially about a first axis substantially normal to the sample surface and positioned at, or near to, the charged particle optical crossover location, and spectroscopically analysing the received secondary particles; and
   b) receiving, about the opening, image light emitted from the sample surface and imaging the received image light for providing a viewable image of the surface.

* * * * *